United States Patent
Murota et al.

(10) Patent No.: US 6,800,544 B2
(45) Date of Patent: Oct. 5, 2004

(54) SEMICONDUCTOR DEVICE HAVING A METAL-SEMICONDUCTOR JUNCTION WITH A REDUCED CONTACT RESISTANCE

(75) Inventors: Junichi Murota, Sendai (JP); Yosuke Shimamune, Sendai (JP); Masao Sakuraba, Sendai (JP); Takashi Matsuura, Sendai (JP)

(73) Assignee: President of Tohoku University, Sendai (JP)

( * ) Notice: Subject to any disclaimer, the term of this patent is extended or adjusted under 35 U.S.C. 154(b) by 0 days.

(21) Appl. No.: 10/222,777

(22) Filed: Aug. 19, 2002

(65) Prior Publication Data

US 2004/0033686 A1 Feb. 19, 2004

Related U.S. Application Data

(62) Division of application No. 09/866,695, filed on May 30, 2001, now Pat. No. 6,621,145.

(30) Foreign Application Priority Data

Sep. 6, 2000 (JP) .................................. 2000-270377

(51) Int. Cl.⁷ .................. H01L 21/28; H01L 21/3205
(52) U.S. Cl. ................................................. 438/604
(58) Field of Search .......................... 438/652, 603, 438/604, 605, 750, 761

(56) References Cited

U.S. PATENT DOCUMENTS

| | | | | |
|---|---|---|---|---|
| 4,839,312 A | * | 6/1989 | Ovshinsky et al. | ......... 437/233 |
| 5,202,573 A | | 4/1993 | Shirai | |
| 5,382,808 A | | 1/1995 | Dreifus et al. | |
| 6,475,277 B1 | * | 11/2002 | Hirota et al. | ............... 117/106 |

FOREIGN PATENT DOCUMENTS

| | | |
|---|---|---|
| JP | 5-326418 | 12/1993 |
| JP | 9-64336 | 3/1997 |
| JP | 2000-91517 | 3/2000 |

* cited by examiner

*Primary Examiner*—Amir Zarabian
*Assistant Examiner*—Pamela E Perkins
(74) *Attorney, Agent, or Firm*—Oblon, Spivak, McClelland, Maier & Neustadt, P.C.

(57) ABSTRACT

A metal-semiconductor junction comprising a wiring metal layer and a semiconductor layer. To reduce the contact resistance of the junction, a region doped with an n- or p-type impurity and having a high carrier concentration of $10^{21}$ cm$^{-3}$ or more is provided in a near-surface part of the semiconductor layer (at a distance of 10 nm or less from the metal layer. The high-carrier concentration region is composed of n- or p-type impurity layers and IV-group semiconductor layers that have been alternately deposited upon another by means of, for example, vapor-phase growth.

2 Claims, 4 Drawing Sheets

TEM photograph showing the cross section of a multi-layer structure

10nm

Distribution of concentration of P in the multi-layer structure measured by a secondary-ion mass spectrometer

SEMICONDUCTOR DEVICE HAVING A METAL-SEMICONDUCTOR JUNCTION WITH A REDUCED CONTACT RESISTANCE

CROSS-REFERENCE TO RELATED APPLICATIONS

This application is based upon and claims the benefit of priority from the prior Japanese Patent Application No. 2000-270377, filed Sep. 6, 2000, the entire contents of which are incorporated herein by reference.

BACKGROUND OF THE INVENTION

1. Field of the Invention

The present invention relates to a semiconductor device and a method of manufacturing a semiconductor device. Particularly, the invention relates to a technique of reducing the electrical resistance of a metal-semiconductor junction.

2. Description of the Related Art

Hitherto, wires of aluminum or the like, which are formed on an insulating layer provided on a semiconductor substrate, are used to connect many elements provided in the semiconductor substrate and constituting an LSI or the like. Alternatively, such wires are used to connect individual semiconductor elements, LSIs or the like to external electric devices. In either case, it is important to decrease, in each semiconductor element, the contact resistance at the junction between any electrode part of the semiconductor substrate and the wiring metal layer contacting the electrode part. A method hitherto used to decrease the contact resistance is to dope the surface region of the substrate with a III-group or V-group impurity at high concentration, reducing the thickness of the Schottky barrier that contacts the wiring metal layer.

Ion implantation has been employed as an LSI-manufacturing technique to dope semiconductor substrates with a III- or V-group impurity at high concentration. Generally, ion implantation comprises three steps. In the first step, the atoms of the impurity are ionized in a vacuum. In the second step, the impurity ions are accelerated with a high voltage and implanted into a surface region of the substrate. In the third step, the substrate is heated, thus activating the impurity ions implanted into the surface region of the substrate. Instead, thermal diffusion may be used to dope semiconductor substrates with a III- or V-group impurity at high concentration. The thermal diffusion is performed in two steps. In the first step, a layer containing the III- or V-group impurity at high concentration is provided on a semiconductor substrate, e.g., a silicon substrate. In the second step, the resultant structure is heated, thereby diffusing the impurity from the layer into the semiconductor substrate.

Both the ion implantation and the thermal diffusion need to include a step of heating the unfinished structure at a high temperature of 600° C. or more. The highest concentration at which the impurity can be implanted into the surface region of the substrate is determined by the solid solubility which the impurity exhibits at the high temperature. Even if the impurity is ion-implanted at high concentration, the impurity injected into the substrate in an ensuing heat treatment may aggregate in the substrate and may become inactive. The carrier concentration is inevitably limited. The carrier concentration in semiconductor substrates, such as Si substrates, is in the order of $10^{20}$ cm$^{-3}$ at most.

Semiconductor substrates into which impurities have been implanted in high concentration are readily oxidized at their surfaces in the atmosphere. If a thin metal film is formed on such a semiconductor substrate, whereby the substrate and the metal film constitute a metal-semiconductor junction, a barrier to moving carriers will be generated at the interface between the metal film and the substrate. Consequently, the metal-semiconductor junction will have high electrical resistance.

A technique has been reported, in which an impurity layer is first formed in the surface region of a semiconductor substrate and a thin semiconductor film is then formed on the impurity layer by means of molecular beam epitaxy or chemical vapor deposition. (See K. Nakagawa et al., Appl. Pnys. Letter 54 (1989), for the film formed by molecular beam epitaxy, and B. Tillack et al., Thin Solid Films, 294 (1997), 15, for the film formed by chemical vapor deposition.) Whether it is formed by molecular beam epitaxy or chemical vapor deposition, the thin semiconductor film has only $10^{20}$ cm$^{-3}$ at most.

The integration density of semiconductor devices is increasing. Semiconductor memories, for example, have now storage capacity of gigabits. In view of this, the resistance of metal-semiconductor junctions is no longer negligible, particularly in LSIs that have numerous elements. The junction between a metal wiring layer and any high-impurity layer formed by thermal diffusion or ion implantation, either being a conventional method, has resistance of at least about $5 \times 10^{-7}$ Ω·cm$^2$. This value is equivalent to a resistance of as high as 5 kΩ per 0.1×0.1 μm unit area of the junction. Being so high, the resistance of the metal-semiconductor junction is a great bar to the manufacture of high-speed, small-power LSIs and to the miniaturization of LSI elements.

BRIEF SUMMARY OF THE INVENTION

The present invention has been made in view of the foregoing. An object of the invention is to provide a technique of doping a semiconductor substrate with an impurity in the manufacture of an LSI, thereby to increase the concentration of a III-group or V-group impurity in a near-surface region of the semiconductor substrate. The increase in the impurity concentration of the near-surface region of the substrate lowers the contact resistance of any metal-semiconductor junction provided in the LSI. This renders it easy to reduce the size of the LSI elements. The LSI may be incorporated into a data communication apparatus or a data-processing apparatuses. If so, the LSI will enhance the operating speed of the apparatus and reduce the power consumption thereof.

To attain the object, a semiconductor device according to the present invention comprises: a IV-group semiconductor layer and a high-carrier-concentration region formed in the IV-group semiconductor layer and having an average carrier concentration of at least $10^{21}$ cm$^{-3}$.

In the semiconductor device, the high-carrier-concentration region may be one that has been formed by laying a plurality of n- or p-type impurity layers and a plurality of IV-group semiconductor layers, one upon another. Further, the high-carrier-concentration region may be one formed by means of chemical vapor-phase growth. Alternatively, the high-carrier-concentration region may be one that has been formed epitaxially.

Another type of a semiconductor device according to the invention comprises a metal-semiconductor junction composed of a semiconductor layer and a metal layer formed on the semiconductor layer. The semiconductor layer has a high-impurity-concentration region containing a III- or V-group element and having an average carrier concentration of at least $10^{21}$ $cm^{-3}$. It is desired that the high-impurity-concentration region be provided at a distance of at most 10 nm from an interface between the metal layer and the semiconductor layer.

In this semiconductor device, the semiconductor layer may have an impurity concentration of at most $10^{20}$ $cm^{-3}$ at the interface between the metal layer and the semiconductor layer. Further, the high-impurity-concentration region may have an average impurity concentration that is an average value for regions existing in a region of the semiconductor layer, which is at least 7 nm thick, the average impurity concentration being at least $10^{21}$ $cm^{-3}$.

Still another type of a semiconductor device according to the invention comprises: a IV-group semiconductor substrate; a ¼-atom layer of impurity, formed on the IV-group semiconductor substrate by adsorbing the impurity in a concentration of about $1.7 \times 10^{14}$ $cm^{-2}$; and a IV-group semiconductor layer epitaxially formed on the ¼-atom layer of impurity.

To attain the object mentioned above, a method of manufacturing the semiconductor device as defined in claim 9, comprising the steps of: supplying a hydride gas containing a III- or V-group element and a hydride gas containing a IV-group element, sequentially and repeatedly into a vapor-phase growth apparatus; and forming a multi-layer structure composed of a plurality of III- or IV-group element layers and a plurality of IV-group semiconductor layers, one deposited upon another, by means of chemical vapor-phase growth at a temperature of at most 500° C. In the method, the hydride containing an III-group element may be $B_2H_6$, and the hydride containing a V-group element may be $PH_3$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described, with reference to the accompanying drawings. The embodiments described below illustrate the principle of the invention. Therefore, the present invention is not limited to the specific structures of the embodiments described below.

Figure 1:
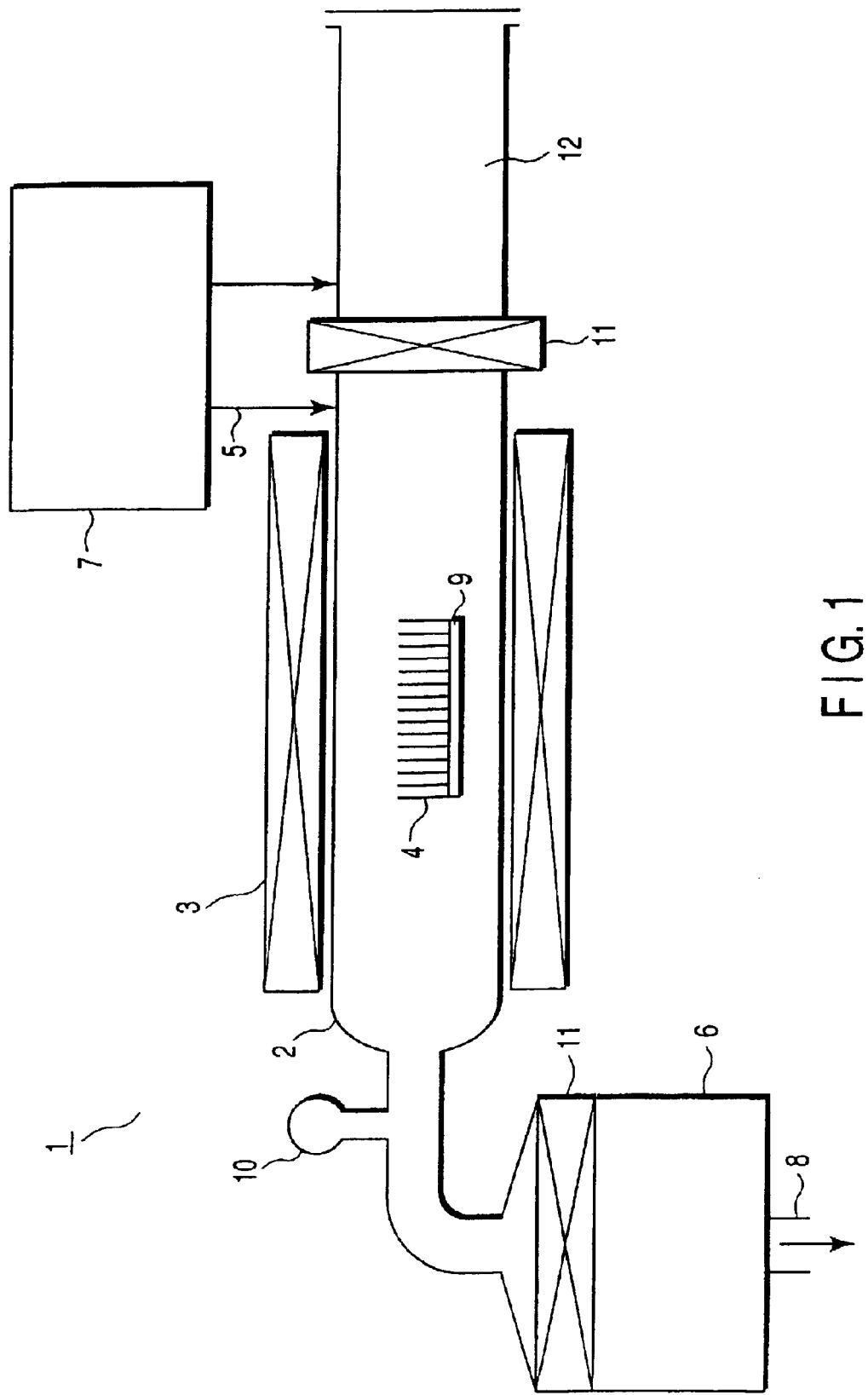
FIG. 1 is a schematic representation of a vapor-phase growth apparatus for manufacturing a semiconductor device according to an embodiment of the present invention.
Figure 4:
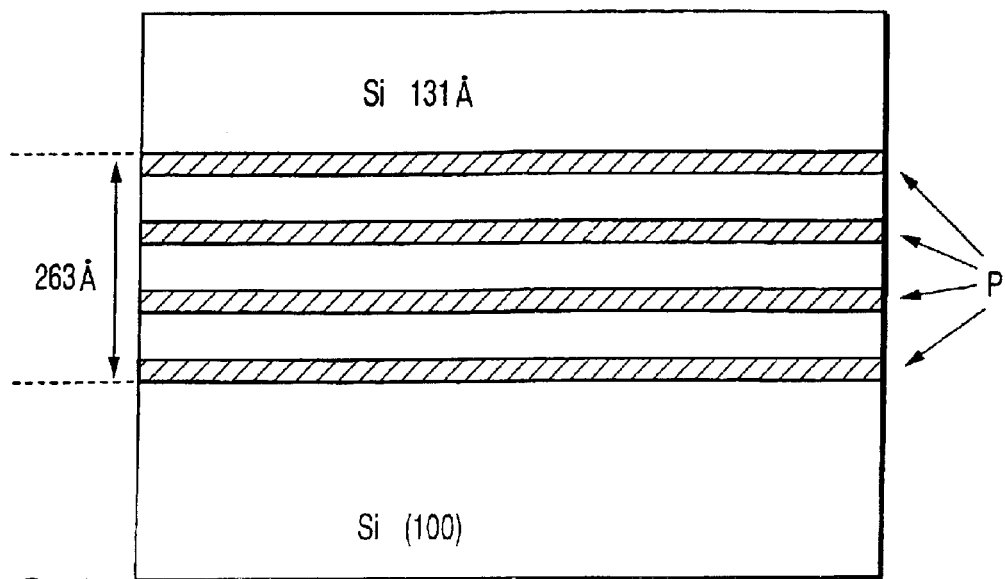
FIG. 4 is a sectional view of a Si/P/Si/P/Si/P/Si multi-layer structure comprising a silicon crystal and four P-atom layers buried in the silicon crystal.

To achieve the object of the invention, or to provide an LSI the LSI which operates at high speeds and which consumes but small power, a layer doped with a III- or V-group impurity and a IV-group semiconductor layer are alternately and repeatedly formed, one upon another as shown in FIG. 4, by using a vapor-phase growth apparatus 1 of the ordinary type illustrated in FIG. 1. In the embodiment of FIG. 1, each impurity layer is a P (phosphorus) layer, and each semiconductor layer is a Si layer. The term "IV-group semiconductor" used herein means silicon (Si), germanium (Ge), carbon (C), or any semiconductor that is composed mainly of at least two of the three semiconductor elements. The method of forming the impurity layers and semiconductor layers is not limited to vapor-phase growth. Rather, the layers may be formed by any other growth method such as so-called "molecular beam epitaxy."

As shown in FIG. 1, the vapor-phase growth apparatus 1 comprises a quartz reaction tube 2, a heating furnace 3, a vacuum pump 6, a high-purity gas supplying system 7, a pressure gauge 10, a gate valve 11, and a nitrogen-purging box 12. The vapor-phase growth apparatus 1 is a transverse furnace. Nonetheless, a vertical furnace or a barrel furnace may be used in place of the apparatus 1.

Semiconductor substrates 4 are arranged on a quartz boat 9. The quartz boat 9 holding the substrates 4 is inserted into the quartz reaction tube 2. While the boat 9 is being inserted into the tube 2, nitrogen keeps flowing in the nitrogen-purging box 12 to prevent the atmospheric air from entering the quartz reaction tube 2. The substrates 4 in the tube 2 are maintained at a predetermined temperature by means of the heating furnace 3.

Impurity-source gas (e.g., $B_2H_6$ containing an III-group element, $PH_3$ containing an V-group element, or the like) and semiconductor-material gas (e.g., $SiH_4$, $GeH_4$, $CH_4$, $CH_3SiH_3$, $Si_2H_6$ or the like, each being a hydride containing, for example, a IV-group element and used as semiconductor material) are alternately introduced, together with carrier gas (e.g., hydrogen gas), from the high-purity gas supplying system 7 into the quartz reaction tube 2 through a gas-introducing port 5. In the tube 2, the gases thus introduced react with one another, whereby an impurity layer and a semiconductor layer are alternately grown, one upon the other. As a result, a multi-layer structure is obtained. In this case, it is desired that the impurity layer of p type or n type and the IV-group semiconductor layer be expitxially formed.

Figure 3A:
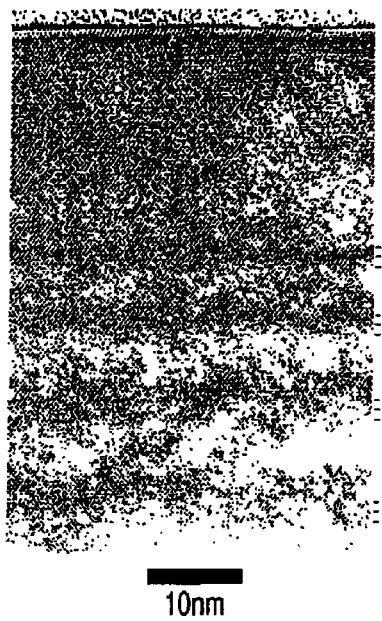
FIG. 3A is a TEM (Transmission Electron Microscope) photograph showing the cross section of a Si/P/Si/P/Si/P/Si/P/Si multi-layer structure made by repeatedly and alternately forming a high concentration P-atom layer and an epitaxially grown silicon layer.
Figure 3B:
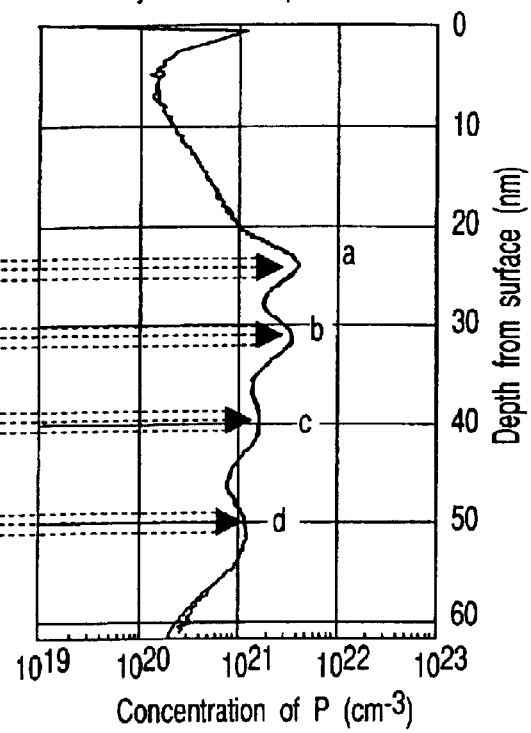
FIG. 3B is a graph representing the distribution of P concentration of the multi-layer structure, which has been determined by a secondary-ion mass spectrometer.

An example of the vapor-phase growth will be described. The impurity-source gas, such as $B_2H_6$ or $PH_3$, is decomposed at a temperature higher than the lowest temperature at which the gas can be decomposed at partial pressure of 1 Pa or more. On the other hand, the semiconductor-material gas, i.e., hydride gas containing a IV-group element, is decomposed at a temperature of 500° C. or less at partial pressure of 1 Pa or more, whereby a semiconductor layer is formed. The decomposition of the impurity-source gas and the decomposition of the hydride gas are alternately repeated. As a result, four high-concentration regions a, b, c and d, for example, are formed as is illustrated in FIGS. 3A and 3B, which have an average impurity concentration of $10^{21}$ cm$^{-3}$ or more. In this example, it is desired that each semiconductor layer formed be 10 nm or less thick.

Figure 2:
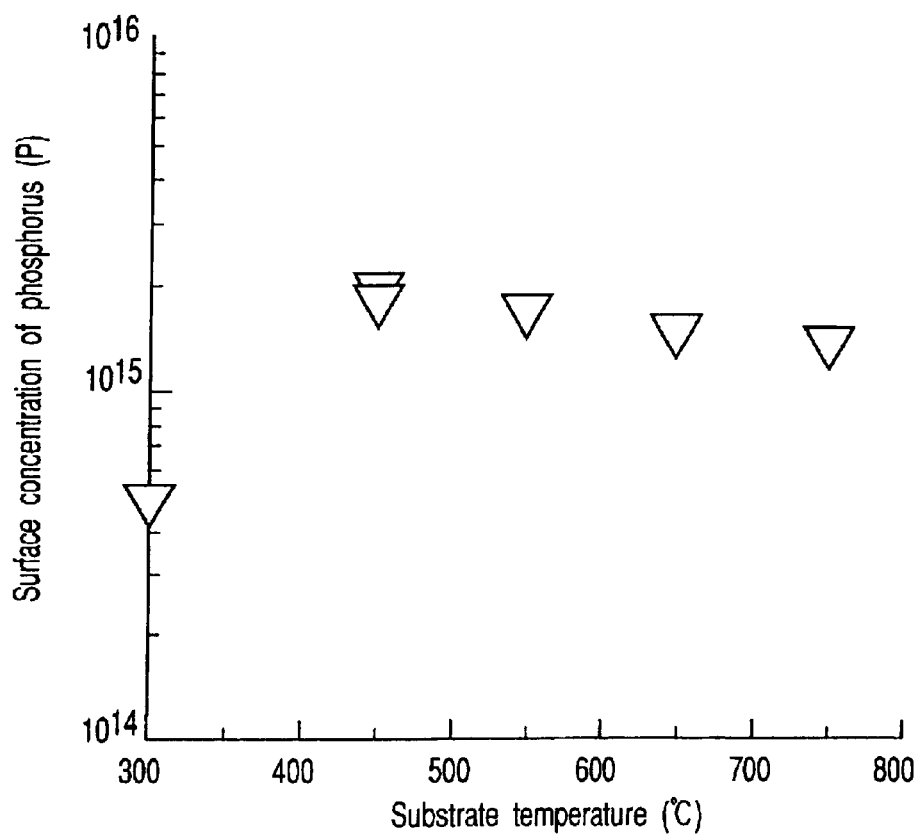
FIG. 2 is a graph illustrating how the concentration of phosphorus (P) adsorbed to the surface of a silicon (Si) substrate depends on the temperature of the silicon substrate.

FIG. 2 illustrates how the concentration of phosphorus adsorbed to the surface of a Si substrate through the reaction of PH$_3$ depends on the temperature of the Si substrate. In this embodiment, the PH$_3$ gas has a partial pressure of 0.26 Pa and is supplied for 90 minutes. Phosphorus is adsorbed to the Si substrate at the partial pressure of 0.26 Pa, forming an n-atom P layer (in which each one-atom layer has an atom concentration of $6.8 \times 10^{14}$ cm$^{-2}$). Particularly, if the temperature of the Si substrate is about 450° C., a three-atom P layer formed on the Si substrate, without diffusion of phosphorus into the Si substrate.

Thereafter, Si is deposited on the P layer by using SiH$_4$ as the semiconductor-material gas, while heating the Si substrate to 450° C. The forming of the P-atom layer and the deposition of the Si layer are alternately repeated, forming a Si/P/Si multi-layer structure as is shown in FIGS. 3A and 3B.

FIG. 3A is a TEM photograph showing the cross-sectional crystal lattice of the multi-layer structure formed by alternately repeating the forming of the P-atom layer and the deposition of the Si layer. FIG. 3B is a graph representing the distribution of the P concentration in the multi-layer structure, which has been determined by a secondary-ion mass spectrometer.

As shown in FIGS. 3A and 3B, four high-concentration regions a, b, c and d are formed among five Si layers, or buried in a Si crystal, whereby a Si/P/Si/P/Si/P/Si/P/Si multi-layer structure. The four regions a to d are different in P concentration. More precisely, the region a has been formed by adsorbing a three-atom P layer, the region b by adsorbing three two-atom P layers, the region c by adsorbing three one-atom P layers, and the region d by adsorbing three 0.5-atom P layers. Some of the P atoms any P layer may leave the Si layer. Hence, all phosphorus adsorbed to the Si layer will not be contained in the silicon crystal. The resultant multi-layer structure is a single crystal. As seen from FIG. 3B, the regions a to d have a maximum P concentration that exceeds $10^{21}$ cm$^{-3}$. In an actual model of the semiconductor device of the invention, one high-concentration region (e.g., region a) is usually provided beneath the electrode metal layer.

FIG. 4 is a sectional view of a Si/P/Si/P/Si/P/Si/P/Si multi-layer structure that is another embodiment of the present invention. As shown in 4, this multi-layer structure comprises a silicon crystal and four P-atom layers buried in the silicon crystal. Each P-atom layer is provided on one (100) Si substrate. Each layer has a P concentration of $4.0 \times 10^{14}$ cm$^{-2}$. Hence, this multi-layer structure has a P concentration of $1.6 \times 10^{15}$ cm$^{-2}$.

Figure 5:
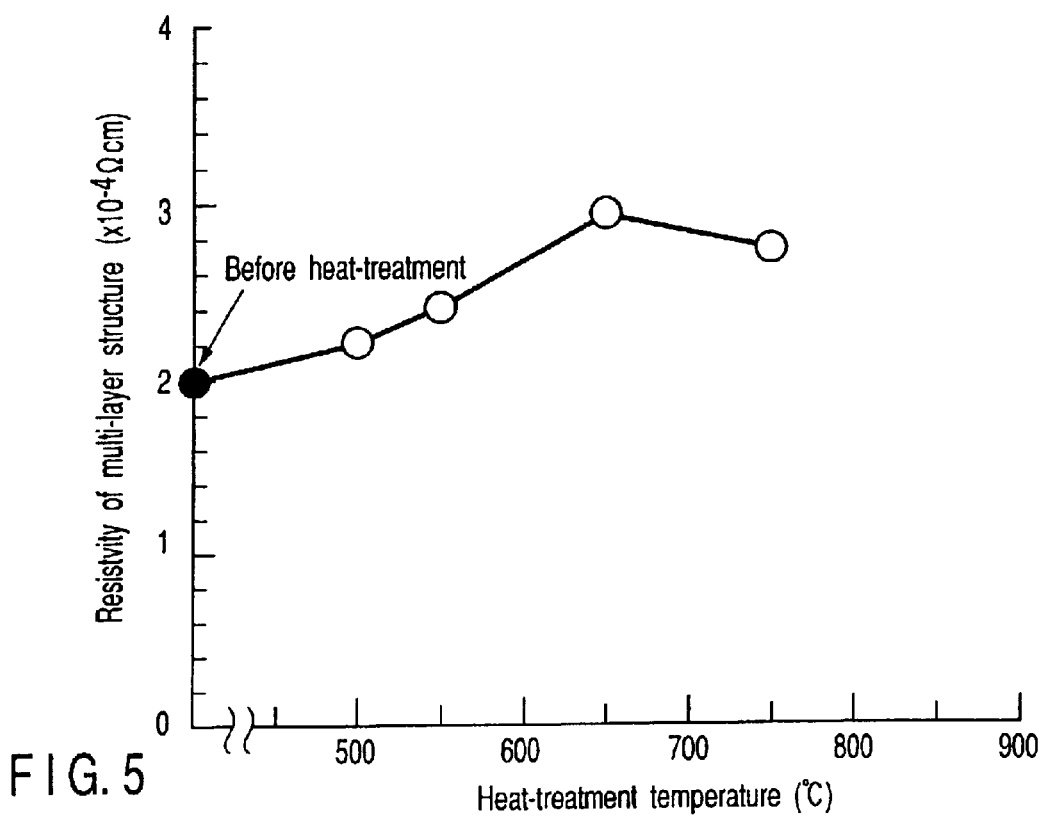
FIG. 5 is a graph illustrating how the resistivity of the structure shown in FIG. 4 depends on the temperature at which the structure is heat-treated.

FIG. 5 illustrates how the resistivity of the multi-layer structure of FIG. 4 depends on the temperature at which the structure is heat-treated for 30 minutes. As seen from FIG. 5, the resistivity increases as the heat-treatment temperature rises, causing precipitation of phosphorus or generating crystal defects. If the heat-treatment temperature is about 450° C. or less, however, the resistivity is only $2 \times 10^{-4}$ Ω·cm, much lower than the value that is attained by the conventional method.

Figure 6:
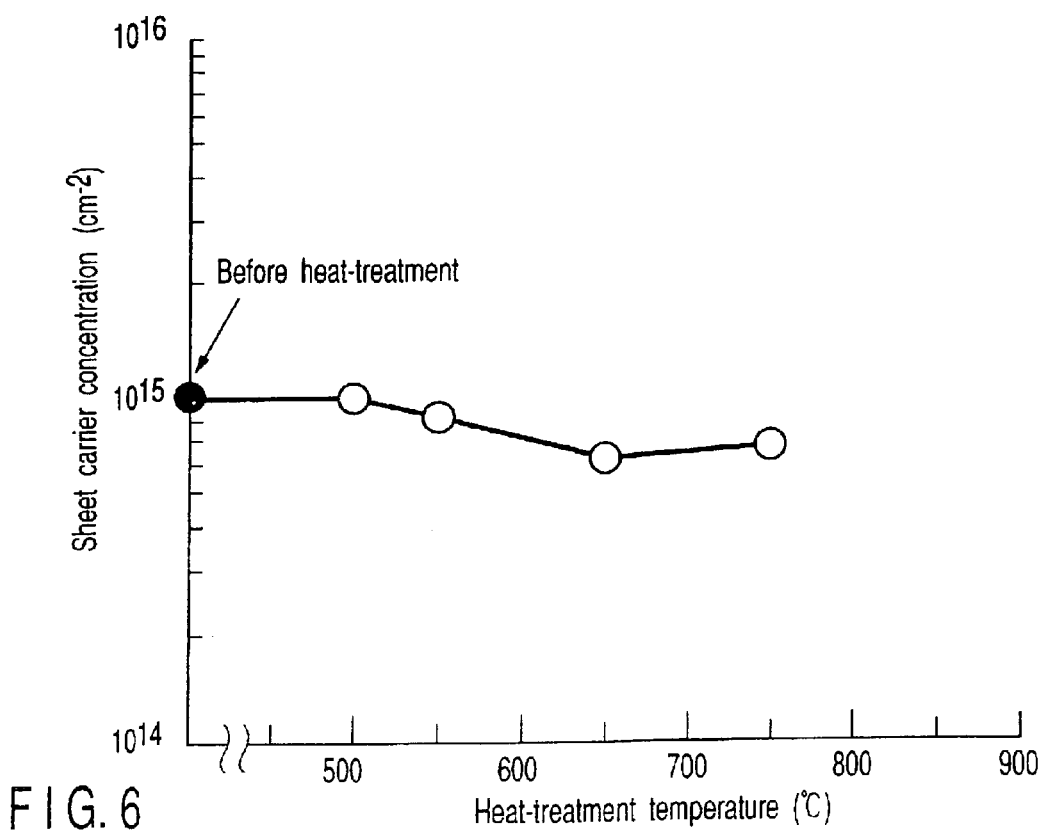
FIG. 6 is a graph depicting how the sheet carrier concentration of the structure shown in FIG. 4 depends on the temperature at which the structure is heat-treated.

FIG. 6 shows how the sheet carrier concentration of the structure shown in FIG. 4 depends on the temperature at which the structure is heat-treated for 60 minute. In this case, the structure that has four P layers exhibits a high sheet carrier concentration of $1.0 \times 10^{15}$ cm$^{-2}$. The activation ratio of P atoms is high, exceeding 60%. The sheet carrier concentration of each P layer is $2.5 \times 10^{14}$ cm$^{-2}$. If each high concentration P-atom layer is about 2 nm thick, a semiconductor device will be obtained, which has an average carrier concentration of $10^{21}$ cm$^{-3}$ that is much higher than those of the semiconductor devices ever made.

To form a semiconductor region having such a very high carrier concentration it is absolutely necessary to perform an epitaxial growth of Si at a low temperature of 500° C. or less. If the epitaxial growth is carried out at higher temperatures, the carrier concentration or the carrier mobility will change, inevitably increasing the resistivity of the region.

Figure 7:
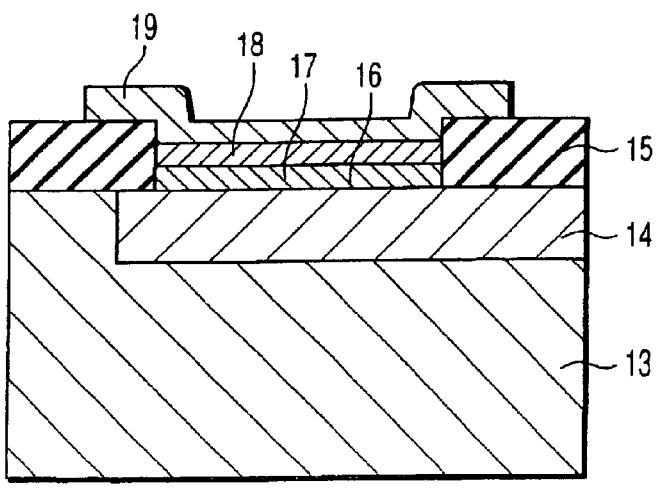
FIG. 7 is a sectional view showing a metal-semiconductor junction according to the present invention.

FIG. 7 shows a metal-semiconductor junction according to the present invention. As shown in FIG. 7, an element 14 is provided in the surface of a semiconductor substrate 13. A Si oxide film 15 is formed on the substrate 13, covering the element 14. The Si oxide film 15 has an opening that is vertically aligned with the electrode region 16 of the element 14 is exposed. In the opening, a high-concentration impurity region 17 is provided and a semiconductor layer 18 of a low impurity concentration is formed on the semiconductor layer 18. The impurity region 17 has an average carrier concentration of $10^{21}$ cm$^{-3}$ or more. The region 17 has been formed by repeatedly and alternately forming an n- or p-type impurity layer and a IV-group semiconductor layer, one upon the other. Further, a wiring metal layer 19 made of, for example, Al or Cu, is provided partly on the semiconductor layer 18 and partly on the Si oxide film 15.

To reduce the resistance of the metal-semiconductor junction to $5 \times 10^{-7}$ Ω·cm$^2$ or less, it is desirable to locate the impurity region 17 (i.e., a region having a carrier concentration of $10^{21}$ cm$^{-3}$ or more) at a distance of 10 nm or less from the interface between the semiconductor layer 18 and the wiring metal layer 19. To suppress the oxidation of the surface of the semiconductor layer 18 in the atmosphere, it is preferred that the layer 18 should have an impurity concentration of $10^{20}$ cm$^{-3}$ or less at its surface that contacts the wiring metal layer 19. It is also desired that the high-concentration impurity region 17 be 7 nm or more thick and have an average impurity concentration of $10^{21}$ cm$^{-3}$ or more.

The present invention is not limited to the miniaturization of the elements of an LSI. Needless to say, the invention can be applied to the reduction of the contact resistance in individual semiconductor elements such as transistors and in power semiconductor elements such as thyristors.

Some embodiments of the invention have been described, with reference to the accompanying drawings. Nonetheless, the present invention is not limited to the embodiments that are no more than examples. various changes and modifications can be made within the scope and spirit of this invention. Further, the embodiments described above pertain to various inventive concepts, and the inventive elements disclosed herein may be used in any appropriate combination, thereby to make various inventions. For instance, even if some of the elements of any embodiment described above are not used, an invention can be made provided that at least one of the objects that are described in Summary of the Invention is attained, thereby achieving at least one of the advantages described in Summary of the Invention.

As has been described above, the present invention makes it possible to form a semiconductor layer and an impurity atom layer alternately and repeatedly, thereby forming regions each having a high concentration of III- or V-group impurity, and to form, on the uppermost region, a semiconductor layer having low impurity concentration and a thickness less than the device length, thereby providing a metal-semiconductor junction.

The effective carrier concentration can therefore be increased to $10^{21}$ cm$^{-3}$ or more. In addition, the surface of the semiconductor layer is hardly oxidized in the atmosphere, thus preventing unnecessary barriers from being generated in the process of forming the metal-semiconductor junction. The contact resistance at the junction therefore decreases to the order of $10^{-8}$ Ω·cm$^2$, thus providing a low-resistance contact that is indispensable to high-speed devices.

The present invention can provide a semiconductor device which has a metal-semiconductor junction, which can easily be formed by the existing methods of manufacturing semiconductor integrated circuits and which operates at high efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

supplying a hydride gas comprising a III- or V-group element and a hydride gas comprising a IV-group element, alternately into a vapor-phase growth apparatus; and forming a multi-layer structure comprising a plurality of III- or V-group element layers and a plurality of IV-group semiconductor layers, one deposited upon another, by chemical vapor-phase growth at a temperature of at most 500° C.

2. The method according to claim 1, wherein the hydride comprising an III-group element is $B_2H_6$, and the hydride comprising a V-group element is $PH_3$.

* * * * *